(12) United States Patent
Kondou

(10) Patent No.: US 6,911,849 B2
(45) Date of Patent: Jun. 28, 2005

(54) CHOPPER TYPE COMPARATOR HAVING INPUT VOLTAGE CONVERSION CIRCUIT OUTPUTTING CONVERTED INPUT VOLTAGE LOWER THAN WITHSTAND VOLTAGE OF INVERTER

(75) Inventor: Mamoru Kondou, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 165 days.

(21) Appl. No.: 10/319,687

(22) Filed: Dec. 16, 2002

(65) Prior Publication Data

US 2003/0222687 A1 Dec. 4, 2003

(30) Foreign Application Priority Data

May 31, 2002 (JP) ........................................ 2002-158855

(51) Int. Cl.[7] .............................................. H03K 17/00
(52) U.S. Cl. ........................................ 327/124; 327/80
(58) Field of Search .............................. 327/77, 80, 89, 327/124

(56) References Cited

U.S. PATENT DOCUMENTS 5,424,657 A * 6/1995 Van Brunt et al. ............ 326/63

5,734,714 A   3/1998 Nishimura

FOREIGN PATENT DOCUMENTS

| JP | 5-199084 | 8/1993 |
|----|----------|--------|
| JP | 5-235289 | 9/1993 |
| JP | 7-161926 | 6/1995 |
| JP | 9-93624  | 4/1997 |
| JP | 2001-53558 | 2/2001 |

* cited by examiner

*Primary Examiner*—Kenneth B. Wells
(74) *Attorney, Agent, or Firm*—Wenderoth, Lind & Ponack, L.L.P.

(57) ABSTRACT

A chopper comparator includes an input voltage conversion circuit, a reference voltage input circuit and a comparison amplifier. The input voltage conversion circuit is applied to an input voltage. The input voltage conversion circuit converts the input voltage to a converted input voltage that is lower than a first voltage. The reference voltage input circuit provides a reference voltage. The comparison amplifier compares a voltage of the converted input voltage with the reference voltage and amplifies a result of the comparison. The comparison amplifier includes an inverter having a withstand voltage substantially equal to the first voltage.

20 Claims, 3 Drawing Sheets

CHOPPER TYPE COMPARATOR HAVING INPUT VOLTAGE CONVERSION CIRCUIT OUTPUTTING CONVERTED INPUT VOLTAGE LOWER THAN WITHSTAND VOLTAGE OF INVERTER

BACKGROUND OF THE INVENTION

The invention relates to a semiconductor device, particularly to a chopper comparator serving as an analog voltage level comparator in a complementary metal-oxide semiconductor circuit (hereinafter referred to as CMOS circuit).

There are generally employed chopper comparators serving as a high-speed CMOS A/D converter which comparators are arranged in parallel with each other and convert analog data to digital data. A conventional chopper comparator comprises two inverters that are connected in series, a capacitor, switching elements and the like which are connected to each other between two inverters. One inverter of these inverters executes a comparing operation and a result of comparison or output thereof is amplified by and outputted from the other inverter.

However, the conventional chopper comparator can receive an input voltage in the range of only not more than a withstand voltage of a metal-oxide semiconductor transistor (hereinafter referred to as MOSTr) of an inverter used for a comparator, and hence it can not be used as an amplifier in the range of voltage which is higher than the withstand voltage of the MOSTr of the inverter.

Assuming that a level of an input voltage is compared with that of a voltage higher than the MOSTr of an inverter, it is necessary to configure a new circuit comprising a MOSTr having a high withstand voltage satisfying such a requirement.

Further, in the above case, if an external input voltage is higher than an internal power supply voltage of an LSI, it is necessary that an external high voltage is supplied to the interior of the LSI.

SUMMARY OF THE INVENTION

The invention has been developed in view of the problems of the conventional chopper comparator. The present invention may provide a chopper comparator capable of receiving an input voltage that is higher than a withstand voltage of a MOSTr of an inverter.

The present invention may provide a chopper comparator capable of comparing a level of an input voltage with that of a voltage which is higher than a withstand voltage of a MOSTr of an inverter.

According to the invention, a chopper comparator includes an input voltage conversion circuit, a reference voltage input circuit and a comparison amplifier. The input voltage conversion circuit is applied to an input voltage. The input voltage conversion circuit converts the input voltage to a converted input voltage that is lower than a first voltage. The reference voltage input circuit provides a reference voltage. The comparison amplifier compares a voltage of the converted input voltage with the reference voltage and amplifies a result of the comparison. The comparison amplifier includes an inverter having a withstand voltage substantially equal to the first voltage.

DETAILED DESCRIPTION OF THE PREFERRED EMBODIMENTS

Figure 1:
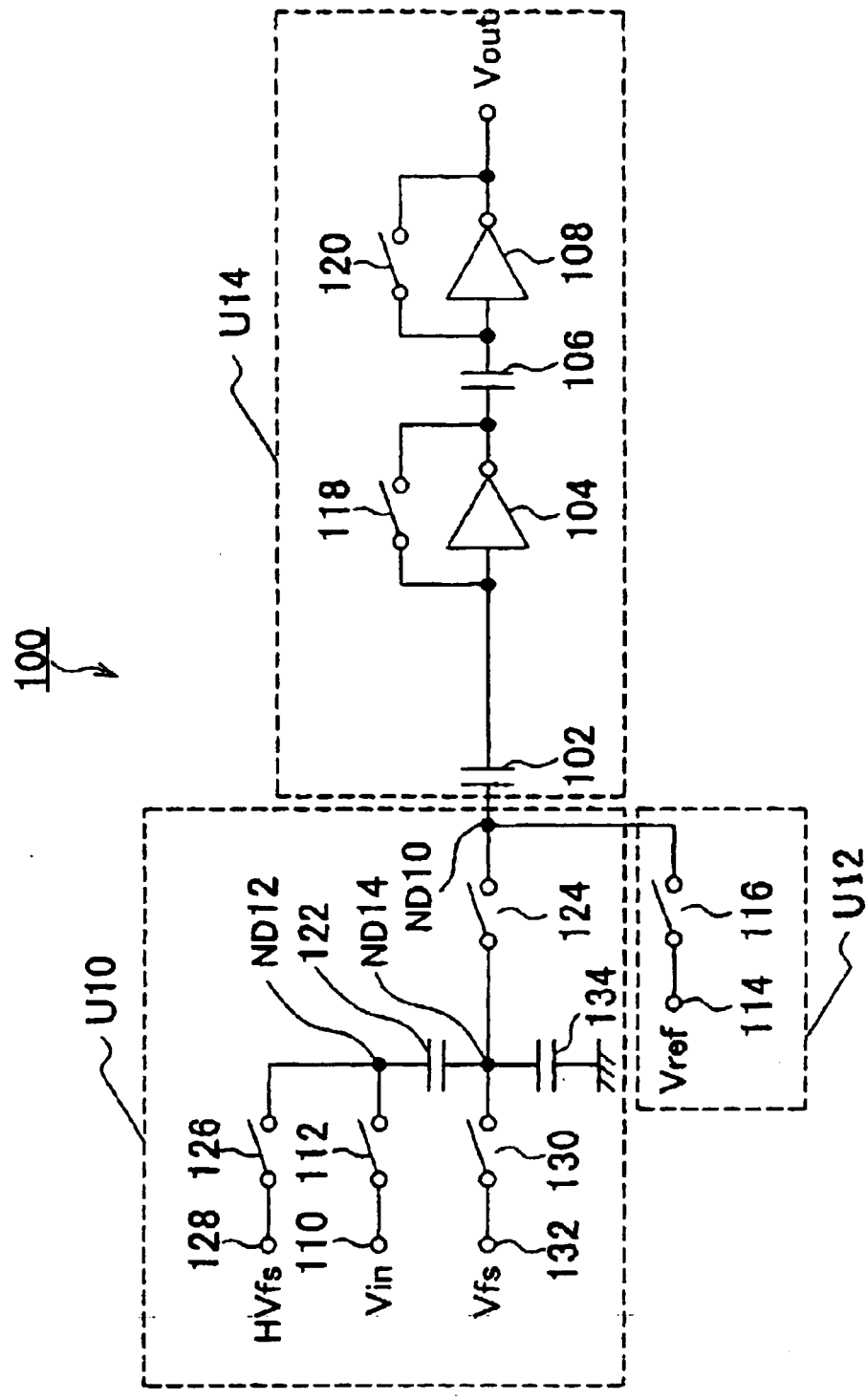
FIG. 1 is a circuit diagram showing the configuration of a chopper comparator according to a first embodiment of the invention.

A chopper comparator according to preferred embodiments of the invention is now described in detail with reference to the attached drawings. Components having substantially the same function are depicted by the same reference numerals and overlapping explanation thereof is omitted.

FIG. 1 is a circuit diagram showing the configuration of a chopper comparator according to a first embodiment of the invention.

A comparison amplifier section U14 of a chopper comparator 100 comprises, like the foregoing conventional chopper comparator, a first capacitor 102, a first inverter 104, a second capacitor 106, and a second inverter 108 which are arranged in this order from an input side and connected to one another in series.

First switching means 112 is provided in an input voltage conversion input section U10 for inputting an input voltage Vin from an input terminal 110 so that the input voltage Vin forming an analog signal and a reference voltage Vref are alternately inputted to an input side of the first capacitor 102 while second switching means 116 for inputting a reference voltage Vref from an input terminal 114 is provided in a reference voltage input section U12.

Third switching means 118 for short-circuiting and resetting an input and an output of the first inverter 104 and fourth switching means 120 for short-circuiting and resetting an input and an output of the second inverter 108 are respectively provided in the comparison amplifier section U14 while interlocking with the first and second switching means 112, 116.

The chopper comparator 100 of the invention has a circuit configuration extending from the input terminal 110 of the input voltage Vin to a first node ND10 which is positioned at the input side of the first capacitor 102 is different from the conventional chopper comparator as set forth hereunder and such a configuration forms the input voltage conversion input section U10.

According to the input voltage conversion input section U10 of the first embodiment, a third capacitor 122 and fifth switching means 124 are provided between the first switching means 112 and the connection node ND10 positioned at the input side of the first capacitor 102, and an external full-scale voltage input terminal 128 is connected to a second connection node ND12 positioned between the first switching means 112 and the third capacitor 122 by way of sixth switching means 126 while an internal full-scale voltage input terminal 132 is connected to a third connection node ND14 positioned between the third capacitor 122 and the fifth switching means 124 by way of seventh switching means 130, and the third connection node ND14 is ground by way of a fourth capacitor 134.

An operation of the chopper comparator of the first embodiment of the invention is described next. Described first of all is an operation explaining how the input voltage Vin of the first embodiment shown in FIG. 1 is subjected to a level conversion by an external full-scale voltage HVfs, an internal full-scale voltage Vfs, the first capacitor 102, the third capacitor 122, and the fourth capacitor 134 with reference to the supplemental explanation view shown in FIG. 2.

Figure 2:
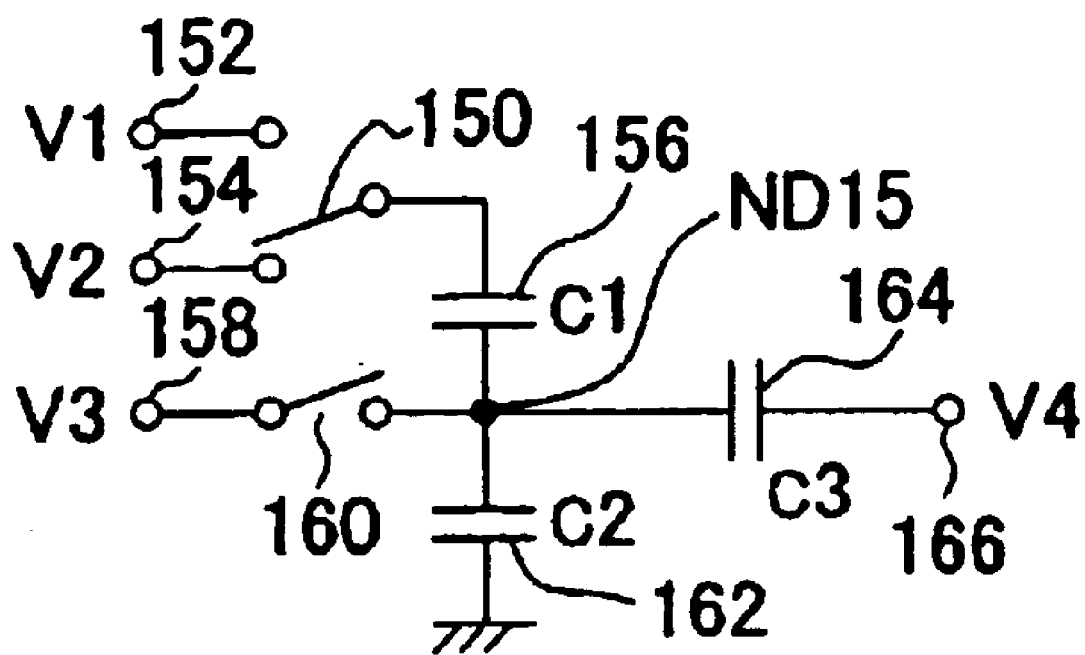
FIG. 2 is a view for supplementarily explaining the first embodiment of the invention.

FIG. 2 is the supplemental explanation view of an operation explaining how the input voltage Vin of the first embodiment shown in FIG. 1 is subjected to a level conversion by the ratio between the external full-scale voltage HVfs and the internal full-scale voltage Vfs.

In FIG. 2, voltages V1, V2, V3 and V4 correspond respectively to the external full-scale voltage HVfs, the input voltage Vin, the internal full-scale voltage Vfs, and a voltage at the input side of the first inverter 104 according to the first embodiment. Further, capacitors 156, 162, and 164 correspond respectively to the third capacitor 122, the fourth capacitor 134, and the first capacitor 102 of the first embodiment, and electric capacitances of the capacitors 156, 162 and 164 are assumed to be C1, C2, and C3. Still further, a single node ND15 corresponds to the third node ND14 and the first node ND10 of the first embodiment.

A switch 150 is turned on, i.e. connected to Voltage V1 side for inputting Voltage V1 while a switch 160 is connected to Voltage V3 side for inputting Voltage V3.

At this time, the capacitor 156 is charged with a potential difference between Voltages V1 and V3 and an electric charge Q1 of the capacitance C1 (V1–V3) is stored therein, while the capacitor 162 is charged with Voltage V3 and an electric charge Q2 of the capacitance C2V3 is stored therein, and the capacitor 164 is charged with a potential difference between Voltages V3 and V4 and an electric charge Q3 of the capacitance C3 (V3–V4) is stored therein.

Then, a switch 160 is turned off for connecting the switch 150 to Voltage V2 side.

At this time, assuming that a potential of one node Nd 15 is Vx, an electric charge Q1' of the capacitance C (V2–Vx) is stored in the capacitor 156 while an electric charge Q2' of the capacitance C2Vx is stored in the capacitor 162 and an electric charge Q3' of the capacitance C3 (Vx–V4) is stored in the capacitor 164.

According to the law of conservation of electric charge of each capacitor at one node ND15, Expression (1) of –Q1+Q2+Q3=–Q1'+Q2'+Q3' is established. Accordingly, when each electric charge in the Expression (1) is substituted with each product of capacitance multiplied by voltage, then Expression (1) is developed and arranged to establish Expression (2) of –C1V1+(C1+C2+C3)V3=–C1V2+(C1+C2+C3)Vx.

Assuming that the potential Vx of one node Nd 15 is changed from Voltage V3 to 0, it is necessary to set a displacement of the potential Vx relative to a displacement of a potential from Voltage V1 to Voltage V2 as a condition of a relational expression of the capacitance ratio of each capacitor. As a result of simulation of Expression (2) by the inventors of this application, it is confirmed that the potential Vx is changed from Voltage V3 to approximately 0 relative to a displacement of a potential from Voltage VI to Voltage V2 assuming that Voltage V2 is 0. Consequently, when Expression (2) is arranged assuming that V2=Vx=0, Expression (3) of V1/V3=(C1+C2+C3)/C1 is established.

Accordingly, when Expressions (2) and (3) are arranged, Expression (4) of Vx=V2·(V3/V1) is established. That is, when the capacitance of the capacitor is arbitrarily set from the ratio of the initial voltage V3/V1 in accordance with Expression (3), the potential Vx can be varied in the range from the initial value V3 to 0 at the ratio of initial voltage V3/V1 of one node ND 15 irrespective of Voltage V4. For example, assuming that V1=5V, V3=3V, and the capacitance ratio of each capacitor is set at the ratio of C1:C2:C3=9:4:2 according to Expression (3), the potential of Vx becomes Vx=2V×(3V/5V)=1.2V based on Expressions (3) and (4) if Voltage V1 is varied from the initial value 5V to 2V, while the potential of Vx becomes Vx=0V if Voltage V1 is varied from Voltage V2 to 0V.

Assuming that the supplemental explanation shown in FIG. 2 is a premise, the operation of the chopper comparator of the first embodiment is described next.

First of all, as an initial state, all the first to seventh switching means 112, 116, 118, 120, 124, 126 and 130 are turned off. At this time, it is assumed that the external full-scale voltage HVfs which is larger than the input voltage Vin is applied to the external full-scale voltage input terminal 128 while the internal full-scale voltage Vfs which is the same magnitude as the internal power supply voltage is applied to the internal full-scale voltage input terminal 132.

Next, the third, fourth, fifth, sixth and seventh switching means 118, 120, 124, 126 and 130 are rendered in conductive state (hereinafter simply referred to as rendered conductive), then the potentials of the third node ND14 and the first node ND10 positioned between the third and fourth capacitors 122 and 134 are rendered to have the same magnitude as the internal full-scale voltage Vfs while the potential of the electrode at the side of the second connection node ND12 of the third capacitor 122 is rendered to have the same magnitude as the external full-scale voltage HVfs. At this time, the external full-scale voltage HVfs has to have an magnitude to realize that the product of the ratio between the external full-scale voltage HVfs and the internal full-scale voltage Vfs and the input voltage, i.e. (Vfs/Hvfs) Vin is lower than a withstand voltage of the MOSTr of the inverter.

At this time, an electric charge is stored in the fourth capacitor 134 up to the potential of the internal full-scale voltage Vfs while an electric charge is stored in the third capacitor 122 by a potential difference between the external full-scale voltage HVfs and the internal full-scale voltage Vfs, and an electric charge is stored in the first capacitor 102 by a potential difference between the internal full-scale voltage Vfs and the threshold voltage Vth1 of the first inverter 104.

Next, after the sixth and seventh switching means 126, 130 are rendered nonconductive, the first switching means 112 is rendered conductive so that an input period of the input voltage Vin that becomes an analog signal is started.

At this time, the potential Vx1 of the first and third nodes ND10, ND14 is subjected to a level conversion such that the input voltage Vin is multiplied by the ratio between the external full-scale voltage HVfs and the internal full-scale voltage Vfs to become Vx1=Vin·(Vfs/HVfs) which is lower than the withstand voltage of the MOSTr of the first inverter 104.

Accordingly, during such an input period, an electric charge is stored in the third capacitor 122 by a potential difference between the input voltage Vin and the potential Vx1 of the third connection node ND14 while an electric charge is stored in the fourth capacitor 134 up to the potential Vx1 of the third connection node ND14 and an electric charge is stored in the first capacitor 102 by a potential difference between the potential Vx1 of the first node ND10 and the threshold voltage Vth1 of the first inverter 104.

The input voltage Vin is subjected to a level conversion so as to become lower than the withstand voltage of the MOSTr of the first inverter 104 before it is inputted to the comparison amplifier section U14, then the first, third, fourth and fifth switching means 112, 118, 120 and 124 are rendered nonconductive and the second switching means 116 is rendered conductive so that the reference voltage Vref is inputted, and the first capacitor 102 is charged and discharged so as to hold an electric charge which is stored therein by a potential difference between the input voltage Vx1 after the level conversion (the potential of the first node ND10) and the threshold voltage Vth1 of the first inverter 104, and hence the input voltage of the first inverter 104 becomes Vth+Vref−Vx1.

At this time, if the magnitude of the input voltage Vx1 after the level conversion is higher than the reference voltage Vref, the input voltage of the first inverter 104 becomes lower than the threshold voltage Vth1 of the first inverter 104, an output signal from the first inverter 104 is inverted and becomes higher than the threshold voltage Vth1 of the first inverter 104, and it is amplified by way of the second inverter 108 and is outputted as a logical value Vout.

Meanwhile, if the magnitude of the input voltage Vx1 after the level conversion is lower than the reference voltage Vref, the input voltage of the first inverter 104 becomes higher than the threshold voltage Vth1 of the first inverter 104, the output signal from the first inverter 104 is inverted and becomes lower than the threshold voltage Vth1 of the first inverter 104, and it is amplified by way of the second inverter 108 and is outputted as the logical value Vout.

As mentioned above, the comparing operation is executed by the first inverter 104 and the result of the comparison or output is amplified and outputted by the second inverter 108.

As mentioned above, the first inverter 104 and the second inverter 108 operate as an amplifier, and hence a potential difference between the input voltage Vx1, which is converted based on the ratio of the external full-scale voltage HVfs to the internal full-scale voltage Vfs (Vfs/HVfs), and the reference voltage Vref is amplified and the comparing operation is executed.

That is, the analog input voltage Vin which is higher than the withstand voltage of the MOSTr of the first inverter 104 is subjected to a level conversion to become the analog input voltage Vin (Vfs/Hvfs) which is not more than the withstand voltage of the MOSTr, so that the first inverter 104 can execute a comparing operation in the range of the internal full-scale voltage Vfs.

Figure 3:
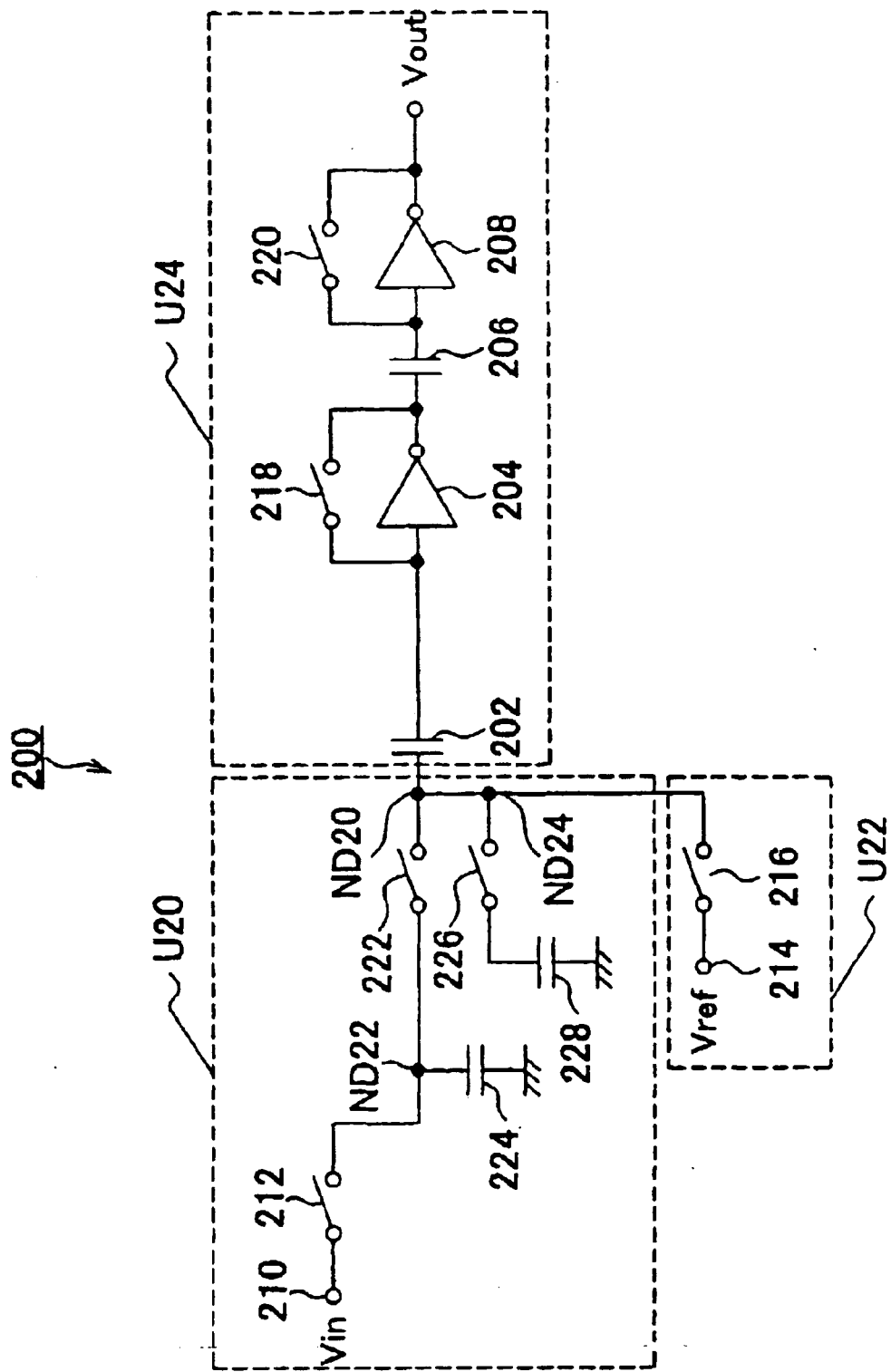
FIG. 3 is a circuit diagram showing the configuration of a chopper comparator according to a second embodiment of the invention.

FIG. 3 is a circuit diagram showing the configuration of a chopper comparator according to a second embodiment of the invention. A comparison amplifier section U24 of a chopper comparator 200 comprises, like the conventional chopper comparator, a first capacitor 202, a first inverter 204, a second capacitor 206, and a second inverter 208 which are arranged in this order from an input side and connected to one another in series.

First switching means 212 is provided in an input voltage conversion input section U20 for inputting an input voltage Vin from an input terminal 210 so that the input voltage Vin forming an analog signal and a reference voltage Vref are alternately inputted to an input side of the first capacitor 202 while second switching means 216 for inputting the reference voltage Vref from an input terminal 214 is provided in a reference voltage input section U22.

Third switching means 218 for short-circuiting and resetting an input and an output of the first inverter 204 and fourth switching means 220 for short-circuiting and resetting an input and an output of the second inverter 208 are respectively provided in the comparison amplifier section U24 while interlocking with the first and second switching means 212, 216.

The chopper comparator 200 of the second embodiment has a circuit configuration extending from the input terminals 210 of the input voltage Vin to a first node ND20 which is positioned at the input side of the first capacitor 202 is different from the conventional chopper comparator as set forth hereunder and such a configuration form the input voltage conversion input section U20.

According to the input voltage conversion input section U20 of the second embodiment, fifth switching means 222 is provided between the connection node ND20 positioned at the input side of the first capacitor 202 and the first switching means 212, while a second node ND22 positioned between the first switching means 212 and the fifth switching means 222 is grounded by way of a third capacitor 224, and a third node ND24 positioned between the first node ND20 and the reference voltage input section U22 is grounded by way of sixth switching means 226 and a fourth capacitor 228.

An operation of the second embodiment of the invention is described next.

First of all, as an initial state, all the first to sixth switching means 212, 216, 218, 220, 222 and 226 are turned off.

Next, after the third, fourth and fifth switching means 218, 220 and 222 are rendered conductive, the first switching means 212 is rendered conductive so that an input period of the input voltage Vin serving as an analog signal is started.

During the input period, an electric charge is stored in the third capacitor 224 up to the potential of the input voltage Vin and an electric charge is stored in the first capacitor 202 by a potential difference between the input voltage Vin and the threshold voltage Vth1 of the first inverter 204.

Upon expiration of the input period of the input voltage Vin, the first switching means 212 is rendered nonconductive, and the sixth switching means 226 is rendered conductive so that a hold period is started.

During the hold period, the electric charges which are stored in the first and third capacitors 202, 224 during the input period are distributed in compliance with the capacitance ratio of the first, third and forth capacitors 202, 224 and 228. When the input voltage level is Vin, assuming that the capacitance ratio of the first, third and forth capacitors 202, 224 and 228 is C1:C3:C4, an electric charge is distributed to each capacitor during the hold period so that the voltage Vx2 of the first node ND20 becomes (C1+C3)/(C1+C3+C4)·Vin. That is, the input voltage Vin can be lowered to an arbitrary voltage level by the third and fourth capacitors 224, 228 based on each capacitance ratio.

During the hold period, the voltage Vx2 of the first node ND20 is lowered from the input voltage Vin to Voltage Vx2=(C1+C3)/(C1+C3+C4)·Vin, and an electric charge is stored in the first capacitor 202 by a potential difference between Voltage Vx2 of the first node ND20 and the threshold voltage Vth1 of the first inverter 104.

When the second switching means 216 is rendered conductive after the third, forth, fifth and sixth switching means 218, 220, 222, and 226 are rendered nonconductive, the reference voltage Vref is inputted, and the first capacitor 202 is charged and discharged so as to hold an electric charge which is stored by a potential difference between the input voltage Vx2 (potential of the first node ND20), after the first capacitor 202 is subjected to a level conversion, and the threshold voltage Vth1 of the first inverter 204, so that the input voltage of the first inverter 204 becomes Vth1+Vref−Vx2.

At this time, if the magnitude of the input voltage Vx2 is higher than the reference voltage Vref after the level conversion, the input voltage of the first inverter 204 becomes lower than the threshold voltage Vth1 of the first inverter 204 so that an output signal from the first inverter 204 is inverted and becomes higher than the threshold voltage Vth1 of the first inverter 204, and it is amplified by way of the second inverter 208 and is outputted as the logical value Vout.

Meanwhile, if the magnitude of the input voltage Vx2 is lower than the reference voltage Vref after the level conversion, the input voltage of the first inverter 204 becomes higher than the threshold voltage Vth1 of the first inverter 204, an output signal from the first inverter 204 is inverted and becomes lower than the threshold voltage Vth1 of the first inverter 204, and it is amplified by way of the second inverter 208 and is outputted as a logical value Vout.

As mentioned above, the comparing operation is executed by the first inverter 204 and the result of the comparison or output is amplified and outputted by the second inverter 208.

As mentioned above, the first inverter 204 and the second inverter 208 operate as an amplifier, and a potential difference between the input voltage Vin, which is converted by the capacitor, and the reference voltage Vref is amplified and the comparing operation is executed.

That is, an electric charge of the analog input voltage Vin which is higher than the withstand voltage of the MOSTr of the first inverter 204 is distributed at the capacitance ratio of each capacitor, and it is subjected to a level conversion to become the analog input voltage (C1+C3)/(C1+C3+C4)·Vin which is not more than the withstand voltage of the MOSTr, so that a comparing operation can be executed.

Although the preferred embodiments of the invention have been described with reference to the attached drawings, the invention is not limited to such preferred embodiments. It is evident that a person skilled in the art can conceive examples of various changes and modifications within a category of a technical ideal as set forth in the attached claims, and hence it is considered as a matter of course that such examples of various changes and modifications are included in the technical scope of the invention.

For example, according to the first embodiment, it is described in respect of the chopper comparator but it can be applied to a logical input of a high impedance CMOS.

Further, according to the second embodiment, although the comparing operation of the chopper comparator is executed relative to one input voltage, if there are provided multiple input voltage input terminals and input switching means which are arranged in parallel with one another to reach the fifth switching means, and a capacitor which is interposed between one node ND positioned between the input switching means and the fifth switching means and a position where it is grounded and is varied, the second embodiment can be applied to an analog/digital conversion where multiple input voltages Vin are subjected to comparing operation at any time by one reference voltage Vref.

Further, according to the first and second embodiments, if the capacitance of the capacitor which is used for the sample hold capacitance is increased, it can be applied to a capacitive array analog/digital conversion.

As mentioned above, according to the invention, it is possible to realize the chopper comparator capable of comparing an input voltage with a reference voltage by subjecting the input voltage to a level conversion so as to be lower than a withstand voltage of the MOSTr of the inverter when the input voltage, which is higher than the withstand voltage of the MOSTr of the inverter, is inputted.

What is claimed is:

1. A chopper comparator comprising:
   an input voltage conversion circuit operable to receive an input signal having an input voltage that is higher than a first voltage and to convert the input voltage to a converted input voltage that is lower than the first voltage;
   a reference voltage input circuit operable to provide a reference voltage; and
   a comparison amplifier operable to compare a voltage of the converted input voltage with the reference voltage and to amplify a result of the comparison, the comparison amplifier including an inverter having a withstand voltage substantially equal to the first voltage.

2. The chopper comparator according to claim 1, wherein the comparison amplifier includes a first capacitor connected to receive the converted input voltage and the reference voltage.

3. The chopper comparator according to claim 2, wherein the comparison amplifier further includes,
   a first inverter having an input connected to the first capacitor and an output,
   a first switch connected between the input and output of the first inverter,
   a second capacitor having a first terminal connected to the output of the first inverter and a second terminal,
   a second inverter having an input connected to the second terminal of the second capacitor and an output, and
   a second switch connected between the input and output of the second inverter.

4. The chopper comparator according to claim 1, wherein the input voltage conversion circuit converts the input voltage based on a proportion of an internal full-scale voltage to an external full-scale voltage.

5. The chopper comparator according to claim 4, wherein the input voltage conversion circuit includes
   an input voltage terminal receiving the input voltage;
   an internal voltage terminal receiving the internal full scale voltage,
   an external voltage terminal receiving the external full scale voltage,
   an output node,
   a first node,
   a second node,
   a first switch connected between the output node and the first node,
   a second switch connected between the first node and the internal voltage terminal,
   a third switch connected between the second node and the input voltage terminal,
   a fourth switch connected between the second node and the external voltage terminal,
   a first capacitor connected between the first node and a reference voltage source, and
   a second capacitor connected between the first and second nodes.

6. The chopper comparator according to claim 1, wherein the input voltage conversion circuit includes a plurality of capacitors.

7. The chopper comparator according to claim 6, wherein the input voltage conversion circuit converts the input voltage based on a proportion of capacitances of the capacitors.

8. The chopper comparator according to claim 7, wherein the input voltage conversion circuit includes
an input voltage terminal receiving the input voltage,
an output node,
a first node,
a second node,
a first switch connected between the output node and the first node,
a second switch connected between the first node and the internal voltage terminal,
a third switch connected between the output node and the second node,
a first capacitor connected between the first node and a reference voltage source, and
a second capacitor connected between the second node and the reference voltage source.

9. A chopper comparator comprising:
an input voltage conversion circuit operable to receive an input signal having an input voltage that is higher than a first voltage and to covert the input voltage to a converted input voltage that is lower than the first voltage;
a reference voltage input circuit operable to provide a reference voltage; and
a comparison amplifier operable to compare a voltage of the converted input voltage with the reference voltage and to amplify a result of the comparison, the comparison amplifier including a circuit having a transistor that has a withstand voltage substantially equal to the first voltage.

10. The chopper comparator according to claim 9, wherein the comparison amplifier includes a first capacitor connected to receive the converted input voltage and the reference voltage.

11. The chopper comparator according to claim 10, wherein the comparison amplifier further includes
a first inverter having an input connected to the first capacitor and an output,
a first switch connected between the input and output of the first inverter,
a second capacitor having a first terminal connected to the output of the first inverter and a second terminal,
a second inverter having an input connected to the second terminal of the second capacitor and an output, and
a second switch connected between the input and output of the second inverter.

12. The chopper comparator according to claim 9, wherein the input voltage conversion circuit converts the input voltage based on a proportion of an internal full-scale voltage to an external full-scale voltage.

13. The chopper comparator according to claim 12, wherein the input voltage conversion circuit includes
an input voltage terminal receiving the input voltage,
an internal voltage terminal receiving the internal full scale voltage,
an external voltage terminal receiving the external full scale voltage,
an output node,
a first node,
a second node,
a first switch connected between the output node and the first node,
a second switch connected between the first node and the internal voltage terminal,
a third switch connected between the second node and the input voltage terminal,
a fourth switch connected between the second node and the external voltage terminal,
a first capacitor connected between the first node and a reference voltage source, and
a second capacitor connected between the first and second nodes.

14. The chopper comparator according to claim 9, wherein the input voltage conversion circuit includes a plurality of capacitors.

15. The chopper comparator according to claim 14, wherein the input voltage conversion circuit converts the input voltage based on a proportion of capacitances of the capacitors.

16. The chopper comparator according to claim 15, wherein the input voltage conversion circuit includes
an input voltage terminal receiving the input voltage,
an output node,
a first node,
a second node,
a first switch connected between the output node and the first node,
a second switch connected between the first node and the internal voltage terminal,
a third switch connected between the output node and the second node,
a first capacitor connected between the first node and a reference voltage source, and
a second capacitor connected between the second node and the reference voltage source.

17. A chopper comparator comprising:
an input voltage conversion circuit operable to receive an input signal having an input voltage that is higher than a first voltage and to convert, the input voltage to a converted input voltage that is lower than the first voltage;
a reference voltage input circuit for providing a reference voltage; and
a comparison amplifier for comparing a voltage of the converted input voltage with the reference voltage and amplifying a result of the comparison, the comparison amplifier having a withstand voltage substantially equal to the first voltage.

18. The chopper comparator according to claim 17, wherein the comparison amplifier includes a first capacitor connected to receive the converted input voltage and the reference voltage.

19. The chopper comparator according to claim 17, wherein the input voltage conversion circuit converts the input voltage based on a proportion of an internal full-scale voltage to an external full-scale voltage.

20. The chopper comparator according to claim 17, wherein the input voltage conversion circuit includes a plurality of capacitors, and wherein the input voltage conversion circuit converts the input voltage based on a proportion of capacitances of the capacitors.

* * * * *